Feb. 18, 1969 B. R. KUHL ET AL 3,428,021

MULTIPLE HIGH FREQUENCY TUNING DIAL STRUCTURE

Filed Sept. 4, 1964 Sheet 1 of 2

Inventors:
Bernhard R. Kuhl
Donald Larson
By Hofgren, Wegner, Allen, Stellman & McCord
Attorneys 3,428,021

MULTIPLE HIGH FREQUENCY TUNING DIAL STRUCTURE

Bernhard R. Kuhl, Mount Prospect, and Donald H. Larson, Arlington Heights, Ill., assignors to Warwick Electronics Inc., a corporation of Delaware Filed Sept. 4, 1964, Ser. No. 394,560
U.S. Cl. 116—124.4 7 Claims
Int. Cl. H03j *1/04*

ABSTRACT OF THE DISCLOSURE

A tuning dial structure for use in a wave signal receiver having a multiple mode receiving tuning unit located to the interior of a cabinet having an opening wherein first and second tuning shafts extend outwardly from the tuning unit, characterized in that a first tuning dial is provided adjacent the cabinet opening and connected to the first tuning shaft for movement therewith, the first tuning dial having viewable tuning indicia and a masking surface with an interruption defining a viewing portion; and a second tuning dial is positioned behind the first tuning dial connected to the second shaft, the second tuning dial having a light transmitting band in alignment with the viewable indicia on the first dial and light transmitting indicia in alignment with the masking surface of the first dial and with a source of illumination positioned to the rear of the dials for illuminating the indicia of the two dials.

This invention relates to tuning devices and more particularly to a new and improved indicator structure for television receivers.

With the advent of the ultra-high frequency band being added to all television receivers, it has become desirable to provide a tuning structure wherein but a single knob assembly is used to tune both the UHF and VHF band for both coarse and fine tuning. As an adjunct, it has become also desirable to devise such a means for the presentation of dialing information which utilizes a minimum amount of space and structure and yet satisfactorily cooperates with the single knob tuning structure to provide the viewer with a clear indication of both the mode of frequency which has been selected, as well as the channel within each frequency band to which the set is tuned.

It is therefore a general object of this invention to provide a new and improved tuner structure for a television set or the like.

It is a primary object of this invention to provide a new and improved tuner indicator structure which is particularly adapted for use with tuners wherein the complete fine and coarse tuning over multiple bands thereof is accomplished by tuning about a single axis.

It is another object of this invention to provide a new and improved tuning indicator structure wherein there is provided separate dials for each frequency mode and wherein one of the dials having continuously illuminated indicia acts as a mask preventing the presentation or illumination of the second dial except when the first dial is in a preselected position.

Yet another object of this invention is to provide a new and improved television tuner dial structure wherein first and second frequency indicator dials are concentrically mounted about the axis of the common tuning shaft, and wherein said first dial masks substantially the entire face of the second dial so that only when the small opening in the first dial is in alignment with an opening in the television receiver cabinet can the indicia on the second dial be presented to view.

Yet another object of this invention is to provide a new and improved tuner dial structure for a UHF-VHF combined tuner assembly wherein both coarse and fine tuning of both frequency bands is accomplished about a single tuning axis wherein UHF and VHF dials are positioned in tandem concentrically about the axis of tuning with said VHF dial being provided with light transmitting indicia thereon adjacent a light transmitting band of the UHF dial and wherein said VHF is further provided with a notch in the periphery thereof which is in alignment with an indicia presenting band of the UHF dial so that only when the notch in the VHF dial is in alignment with the opening in the cabinet may the indicia on the UHF dial be seen whereas the indicia on the VHF dial may be constantly presented to view by means of a source of illumination placed behind the light transmitting band of the UHF dial.

Other features and advantages of the invention will be apparent from the following description taken in connection with the accompanying drawings, wherein.

Figure 1:
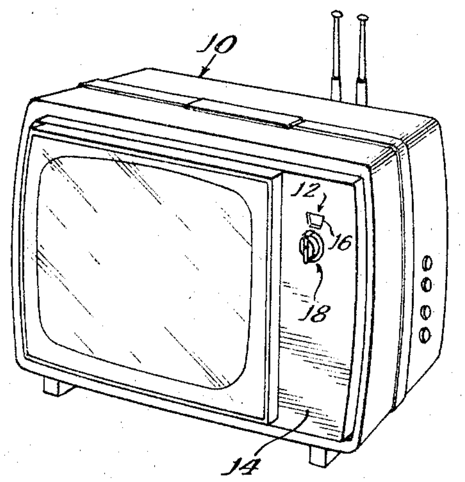
FIGURE 1 is a perspective view of a table model television set embodying the tuner dial structure of this invention.
Figure 2:
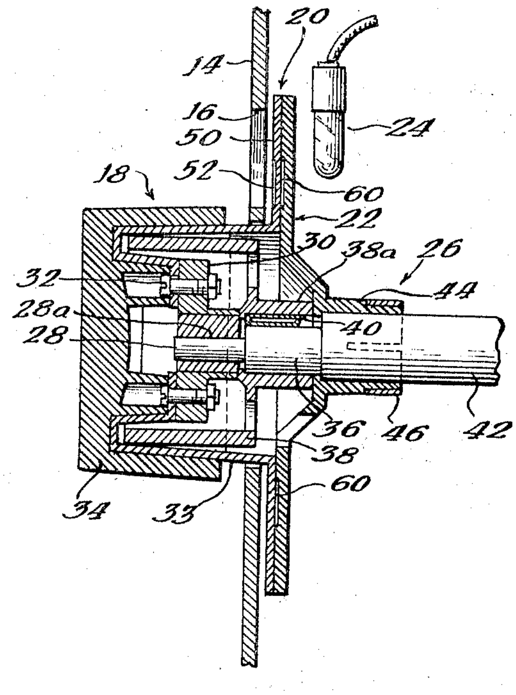
FIGURE 2 is a fragmentary enlarged section view taken through the tuner dial portion of the set shown in FIGURE 1.

Referring now to the drawings, in FIGURE 1 there is shown a table model television set 10 which embodies the tuner structure 12 of this invention. The set 10 is provided with a conventional cabinet having a front wall 14 with a window or opening 16 therein for reading the tuning indicia from the tuner dials. A knob assembly 18 is provided for both fine and coarse tuning UHF and VHF frequencies about a single tuning axis.

The UHF dial 20 and VHF dial 22 are substantially disc-like dials having indicia bearing or transmitting portions and are mounted in tandem concentrically about the tuning axis of the tuner. A source of illumination in the form of a conventional light bulb 24 is positioned to the rear of the UHF dial for illuminating indicia on the dials in a manner to be described in detail later. Means 26 is provided for relating the dials and knob assembly 18 with the tuner apparatus (not shown) so that selective turning of one of the knobs of the knob assembly about a single tuning axis will either coarse or fine tune either the UHF or VHF frequency and information relating to the frequency being tuned as well as the channel within that frequency will be presented to the view of the television viewer.

Included in this relating means 26 is a VHF coarse tuning shaft 28 which is connected in the tuner with a well-known VHF stepped tuner apparatus (not shown) for selection of one of 13 channels upon rotation of the shaft. The shaft is provided with a flat portion 28*a* on the periphery at the proximal end thereof to which is frictionally secured an interconnecting member 30. In turn, the VHF tuning dial is secured to the interconnecting member by suitable fastening means 32 which extend through the forwardly extending and partially rearwardly returning integral finger portions of 33 of the VHF dial. Being so connected, it can be readily seen that rotation of the VHF coarse tuning shaft will cause direct rotation of the VHF tuning dial. For decorative purposes, an outer VHF knob 34 is nestably positioned over the finger portions 33 of the VHF dial.

Telescoped over the VHF tuning shaft is a multituning shaft 36 which, by means of suitable clutch and related mechanisms which form no part of this invention and are not shown herein, serves to make suitable adjustments for coarse tuning UHF frequencies as well as fine tuning both VHF and UHF frequencies. A multituning knob 38 is telescoped over the multituning shaft 36 with a suitable spring 40 interposed therebetween to hold the knob on the shaft. The multituning knob 38 is nested within the forwardly extending and rearwardly returning finger portions of the VHF knob. Rotation of the multituning knob will not directly cause rotation of the UHF dial. Telescoped over the multituning shaft is a UHF indicator shaft 42. Through the aforementioned suitable clutch mechanism, rotation of the multituning shaft 36 will indirectly cause rotation of the UHF indicating shaft 42. The sleeve-like neck portion 44 of the UHF dial 22 is clamped about the periphery of the UHF tuning shaft 42 by a suitable clamp ring 46 to fix the UHF tuning dial for rotation relative to the tuning shaft 42.

Figure 3:
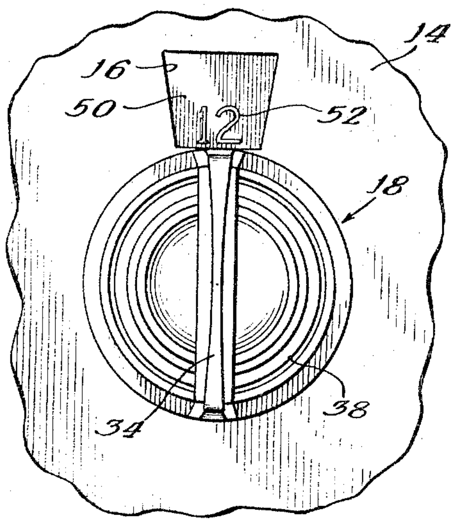
FIGURE 3 is a fragmentary front elevational view of the tuning knob and channel indicating portion of the front of the television set shown in FIGURE 1.
Figure 4:
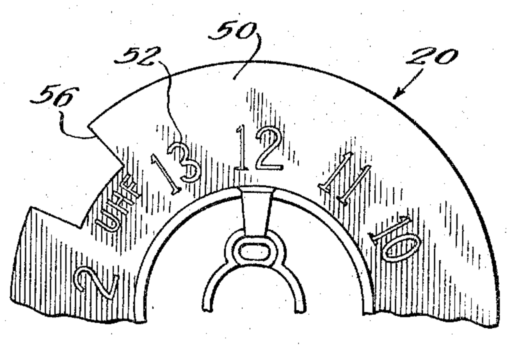
FIGURE 4 is a fragmentary enlarged front elevational view of the VHF dial of the tuner structure of this invention.

To present the tuning formation to view, the VHF dial is provided with a generally flat, disc-like opaque face 50 having translucent indicia 52 distributed in an arcuate band concentric to the tuning axis. The band of indicia is spaced well inwardly from the outer periphery of the VHF dial and a notch 56 is cut away from a small portion of the periphery under which is provided the indicia "UHF." The UHF dial is provided with a translucent arcuate band 60 about a radius that is aligned or coextensive with the radius of the translucent indicia 53 formed on the opaque face of the VHF band so that light from the illumination means 24 may continually project through the translucent band in the UHF dial to illuminate the translucent numbers on the face of the VHF dial. When, as shown in FIGURE 3, the television set is tuned for reception of channel 12 of the VHF band, that portion of the face of the VHF dial which bears the indicia 12 will be positioned in alignment with the window 16 in the front wall of the cabinet and will be illuminated by means of the light 24 positioned to the rear of the UHF dial.

Figure 5:
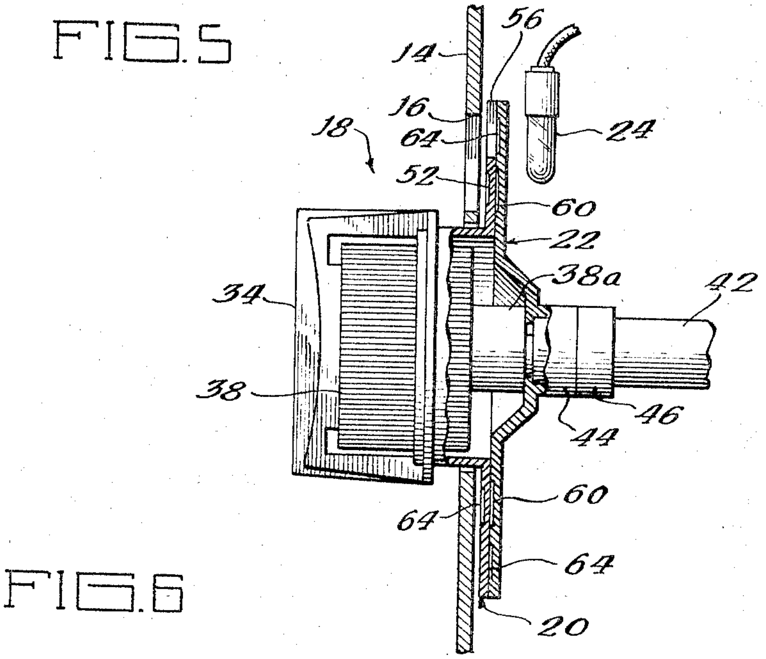
FIGURE 5 is a view similar to FIGURE 2 showing the tuner dial structure of this invention tuned for the reception of UHF frequencies.
Figure 6:
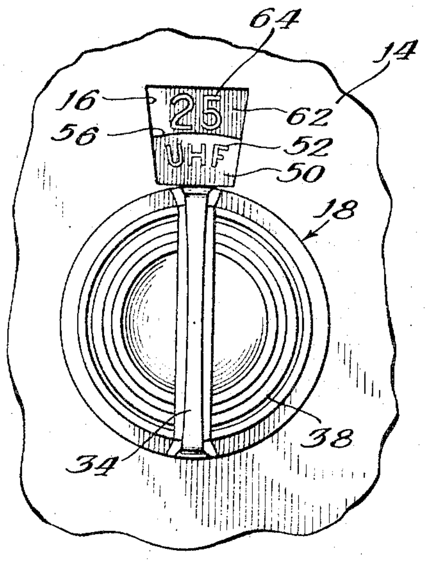
FIGURE 6 is a front elevational view of the tuning knob and channel indicating portion of the set similar to FIGURE 3 showing the set tuned for reception of ultra-high frequency channels.
Figure 7:
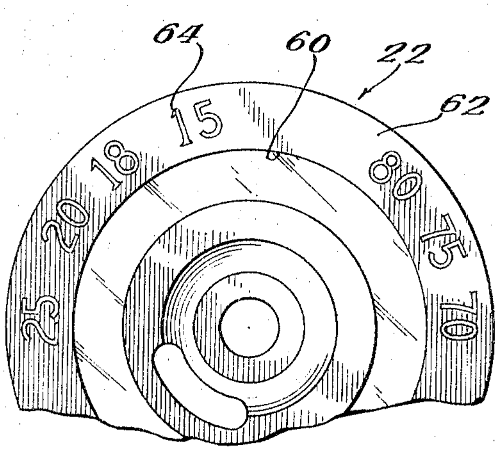
FIGURE 7 is a fragmentary enlarged front elevational view of a portion of the UHF dial of the tuning structure of this invention.

The UHF dial is provided with an outer opaque band 62 having either translucent or chromatically distinct indicia 64 thereon. The indicia are positioned so as to be in substantial alignment with the notch 56 of the VHF knob so that when the tuning apparatus is tuned for UHF reception, as shown in FIGURES 5 and 6, that portion of the VHF dial which bears the indicia "UHF" will be in alignment with the lower portion of the window 16 and the notch thereabove will permit portions of the UHF dial to be viewed therethrough. The light 24 will continue to illuminate the letters UHF so that viewer will be informed that the UHF band frequency is being received and, in those instances where the indicia 64 are translucent, the light will illuminate these indicia as well. In those instances where the indicia 64 are chromatically distinct, they will be readily observable by the eye so that the television viewer will be informed of what channel of UHF television is being tuned.

Thus the dial structure of this invention comprehends the use of a single source of illumination and four easily assembled knobs and dials which are to be telescoped over the two tuning shafts and one dial driving shaft. The tandem positioning of the upright, disc-like dials occupies little front-to-rear space within the television cabinet. The nestable concentric relationship of the four dials enhances the speed and the economy of production while at the same time affording a practical and decorative solution to the problem of presenting tuning information to the view of the television viewer in a tuning apparatus wherein several channels of multiple frequencies are tuned about a single tuning axis.

We claim:

1. For use with a multiple mode tuner having first and second tuning shafts for changing the frequency received by the tuner responsive to movement by the tuning shafts, in combination with a wave signal receiver cabinet having an opening therein, a tuning dial structure comprising: a first tuning dial mounted in the cabinet interior and connected to a first shaft for movement therewith, the first dial having a band of light transmitting indicia thereon including mode and frequency tuning indicia, said first dial further having a masking surface adjacent the band of indicia with a viewing portion formed in the masking surface and a second tuning dial mounted in the cabinet adjacent the opening and to the rear of the first dial, the second dial being connected to the second tuning shaft for movement therewith, said second dial having a light transmitting portion adjacent the light transmitting indicia of the first dial and a band of tuning indicia adjacent the masking portion of the first dial; and a source of illumination to the interior of the cabinet behind the second dial for continually displaying the indicia of the first dial through the cabinet opening and selectively displaying the indicia of the second dial when the first dial is positioned with the mode indicia thereof presented to view through the cabinet opening.

2. The combination of claim 1 wherein said light source comprises a light bulb positioned behind said second dial.

3. The combination of claim 1 wherein the band of light transmitting indicia of the first dial and the light transmitting portion of the second dial are in substantial alignment with each other.

4. The combination of claim 1 wherein the first dial has a disc-like face with the light transmitting figures circumferentially disposed to the interior of the face and the masking surface is concentrially formed in a band surrounding the light transmitting surface and wherein the viewing portion of the masking surface comprises a notch formed in the periphery of the first dial.

5. The combination of claim 4 wherein the second dial has a disc-like face and wherein the light transmitting band is circumferentially disposed in a radius coextensive with that of the light transmitting indicia of the first dial and wherein the second dial indicia are disposed in a band in alignment with the masking surface of the first dial so that when the first dial is positioned with the notch in alignment with the cabinet opening, indicia on the first and second dials will both be presented to view.

6. The combination of claim 5 wherein the first and second dials are mounted in tandem about a common tuning axis.

7. For use in a wave signal receiver having a plurality of drive shafts for connection with a tuning unit for changing the frequency and mode of frequency received by the tuning unit responsive to movement of the drive shafts, the receiver being housed in a cabinet, tuner indicator means, comprising: means providing a source of illumination, said means being positioned to the interior of the cabinet; a first dial connected to one of said shafts for movement responsive to movement of the shaft, said first dial having light transmitting mode and frequency tuning indicia thereon, said first dial further having a masking surface, the masking surface being interrupted to provide a viewing portion thereof, and a second dial connected to another of the shafts and positioned to the rear of the first dial, the second dial having a light transmitting portion adjacent the tuning indicia on the first dial and the second dial having tuning indicia thereon adjacent the masking surface of the first dial, so that the tuning indicia of the first dial adjacent to the cabinet opening will always be presented to view and the tuning indicia of the second dial will be presented to view when the viewable portion of the masking surface is adjacent the cabinet opening.

References Cited

UNITED STATES PATENTS

| | | | |
|---|---|---|---|
| 2,738,758 | 3/1956 | Cutler | 116—124.4 |
| 2,772,351 | 11/1956 | Machlin | 250—20 |
| 2,772,353 | 11/1956 | Browder | 250—20 |
| 2,802,174 | 8/1957 | Staunton | 116—124.4 |
| 2,932,019 | 4/1960 | Pifer et al. | 116—124.4 |
| 3,179,907 | 4/1965 | Brand et al. | 334—1 |
| 3,196,695 | 7/1965 | Dotto | 74—10.41 |
| 3,201,726 | 8/1965 | Laschenski | 334—29 |
| 3,240,182 | 3/1966 | Kemeny | 116—124.4 |

LOUIS J. CAPOZI, *Primary Examiner*.

U.S. Cl. X.R.

74—10.45; 325—464